United States Patent
Guo et al.

(10) Patent No.: US 7,612,454 B2
(45) Date of Patent: Nov. 3, 2009

(54) SEMICONDUCTOR DEVICE WITH IMPROVED CONTACT FUSE

(75) Inventors: Honglin Guo, Plano, TX (US);
Dongmei Lei, Lewisville, TX (US);
Brian Goodlin, Dallas, TX (US); Joe McPherson, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/172,937

(22) Filed: Jul. 14, 2008

(65) Prior Publication Data

US 2008/0265366 A1      Oct. 30, 2008

Related U.S. Application Data

(63) Continuation of application No. 11/380,120, filed on Apr. 25, 2006, now Pat. No. 7,413,980.

(51) Int. Cl.
*H01L 23/52* (2006.01)
*H01L 21/44* (2006.01)

(52) U.S. Cl. ...................... 257/774; 438/668

(58) Field of Classification Search ............. 438/164, 438/668, 672, 675; 257/773–776
See application file for complete search history.

(56) References Cited

U.S. PATENT DOCUMENTS

| | | | | |
|---|---|---|---|---|
| 6,791,135 B2* | 9/2004 | Takenaka | ..................... | 257/296 |
| 7,064,369 B2* | 6/2006 | Koh | ........................... | 257/296 |
| 7,118,958 B2* | 10/2006 | Phan et al. | .................. | 438/250 |
| 7,205,168 B2 | 4/2007 | Oohata et al. | | |
| 2006/0049511 A1 | 3/2006 | Schaefer | | |
| 2006/0279975 A1* | 12/2006 | Choi | .......................... | 363/141 |
| 2007/0246796 A1 | 10/2007 | Guo et al. | | |

* cited by examiner

*Primary Examiner*—Calvin Lee
(74) *Attorney, Agent, or Firm*—Warren L. Franz; Wade J. Brady, III; Frederick J. Telecky, Jr.

(57) ABSTRACT

One aspect of the invention provides an integrated circuit(IC) [400*b*]. The IC comprises transistors [410*b*] and contact fuses [422*b*]. The contact fuses each comprise a conducting layer [424*b*], a frustum-shaped contact [426*b*] has a narrower end that contacts the conducting layer and a first metal layer [427*b*] that is located over the conducting layer. A wider end of the frustum-shaped contact contacts the first metal layer. The frustum-shaped contact has a ratio of an opening of the wider end to the narrower end that is at least about 1.2. The contact fuses each further include a heat sink [432*b*] that is located over and contacts the first metal layer.

20 Claims, 14 Drawing Sheets

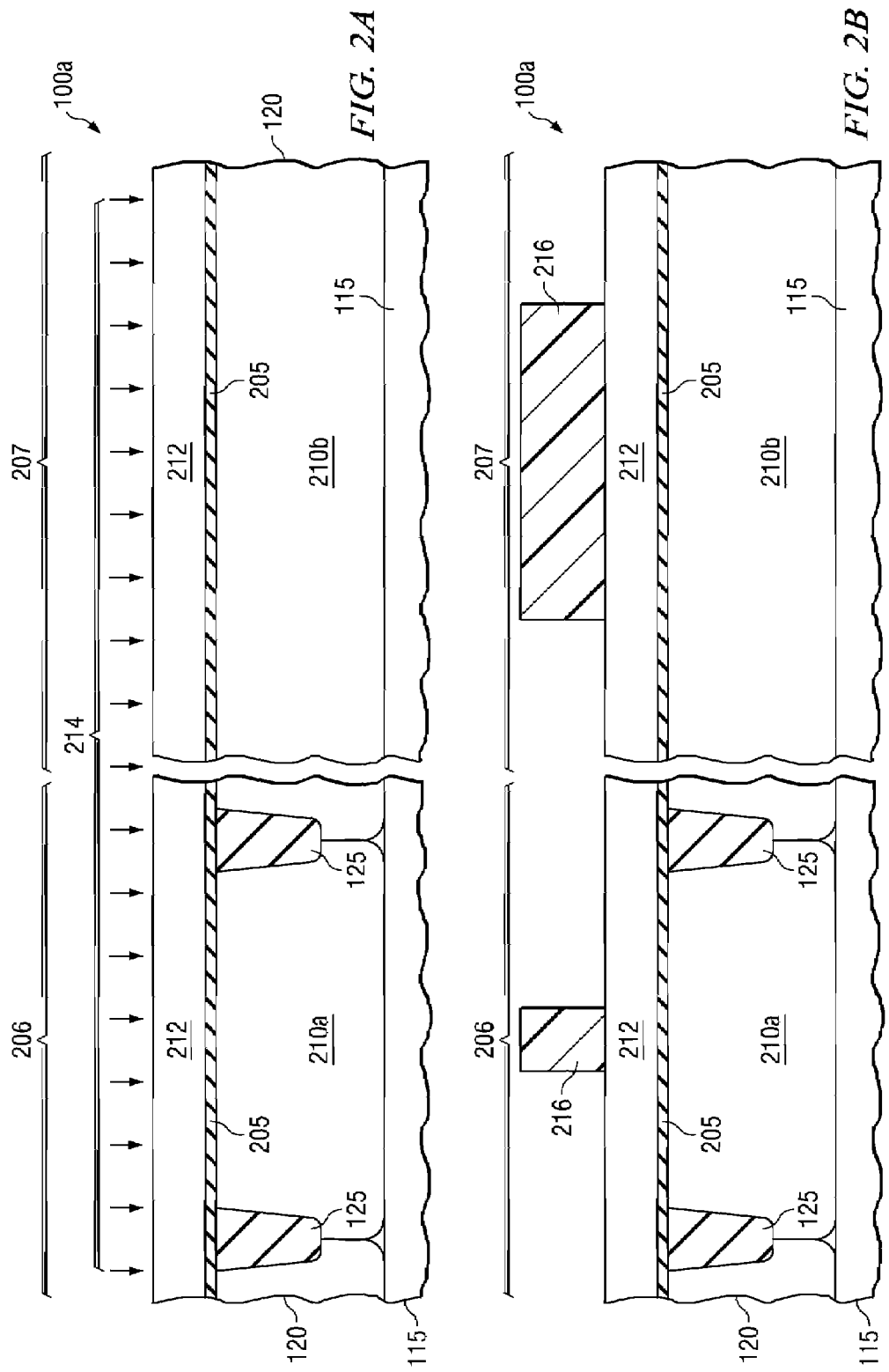

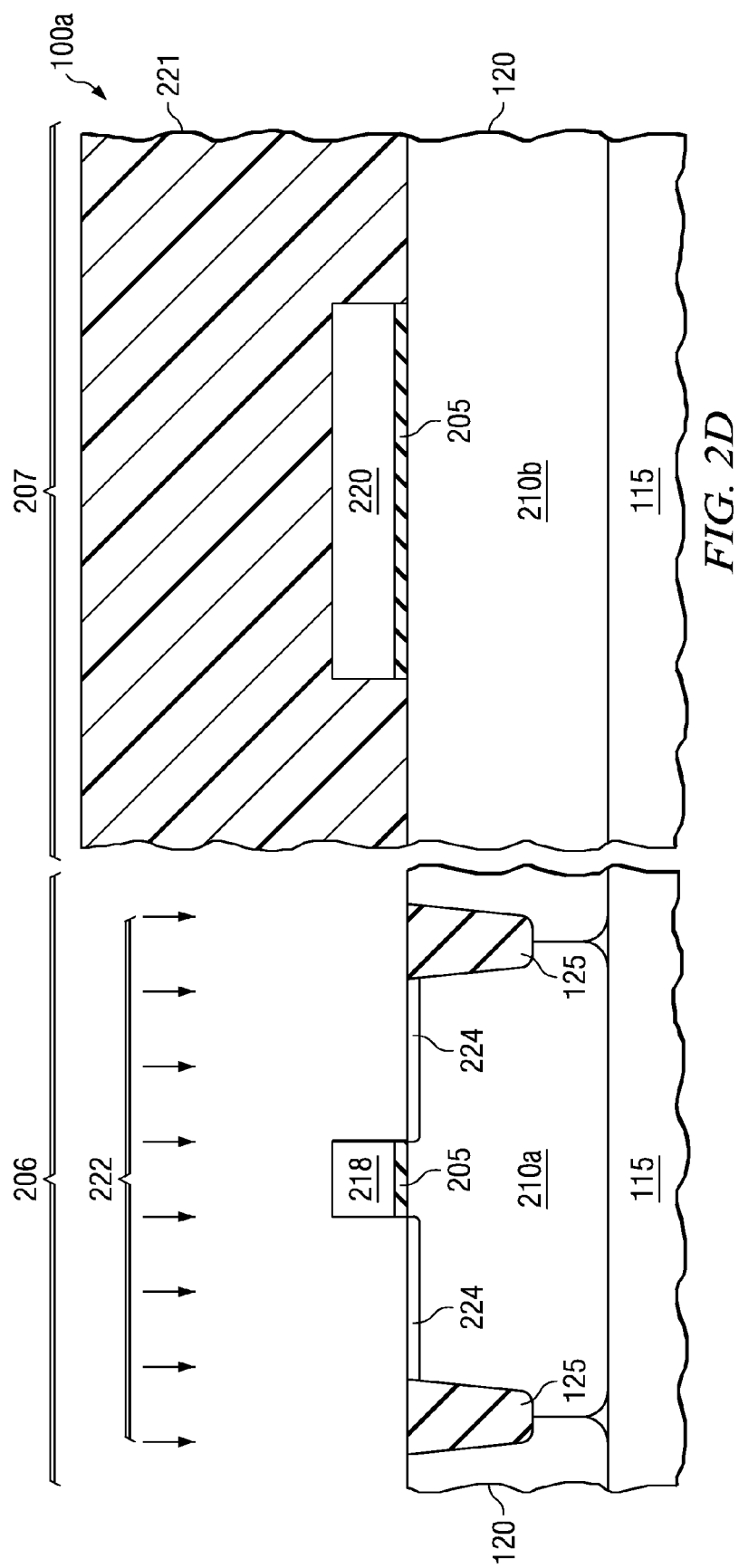

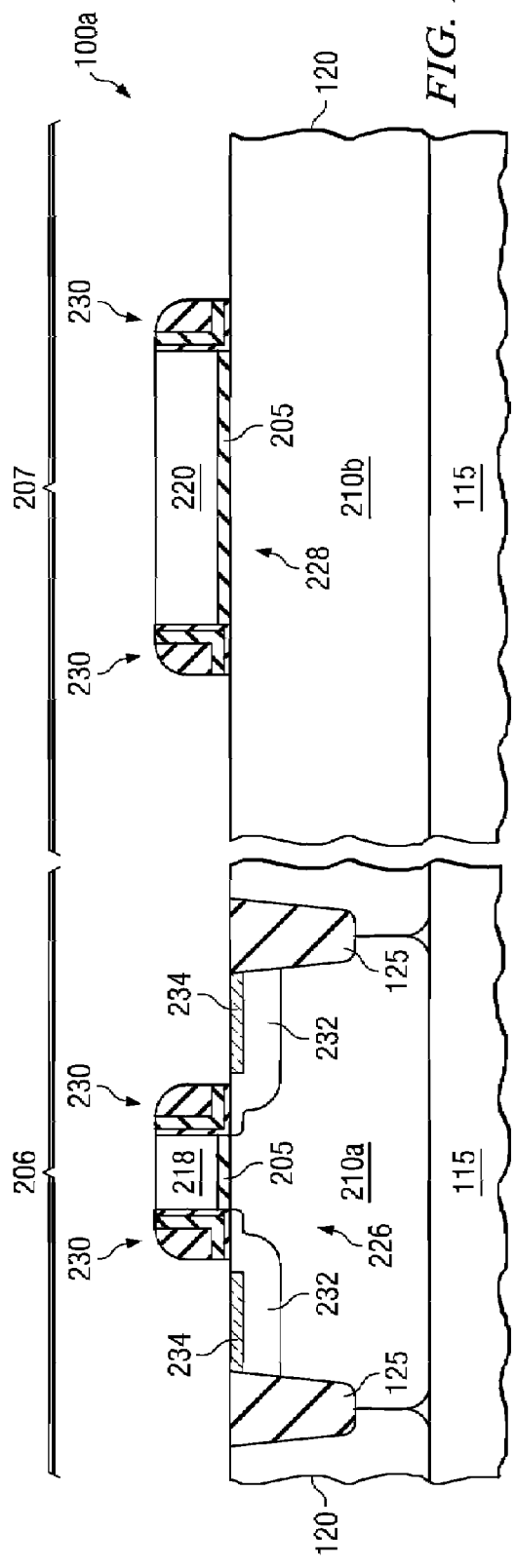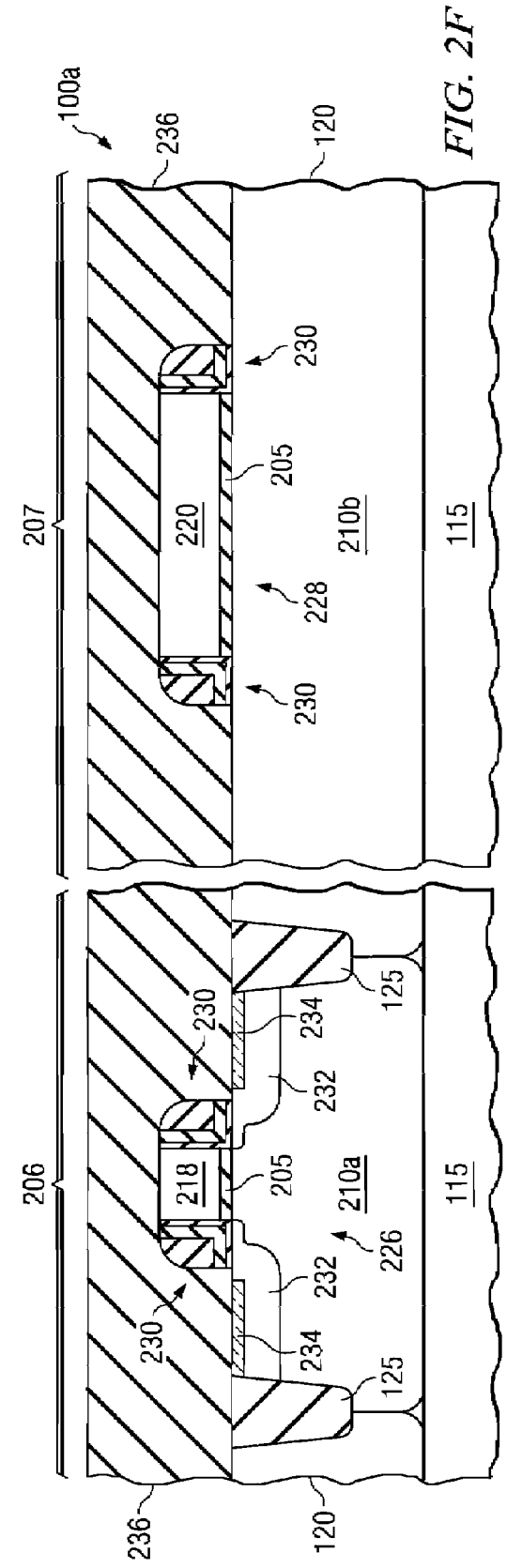

SEMICONDUCTOR DEVICE WITH IMPROVED CONTACT FUSE

CROSS REFERENCE TO RELATED APPLICATION

This application is a continuation of U.S. patent application Ser. No. 11/380,120, entitled "SEMICONDUCTOR DEVICE WITH IMPROVED CONTACT FUSE," filed on Apr. 25, 2006 now U.S. Pat. No. 7,413,980, by Honglin Guo, et al., which is currently pending. The above-listed application is commonly assigned with the present invention and is incorporated herein by reference as if reproduced herein in its entirety.

TECHNICAL FIELD OF THE INVENTION

The invention is directed in general to a semiconductor device and, more specifically, to a semiconductor device having increased contact fuse reliability.

BACKGROUND OF THE INVENTION

The pursuit of increasing quality, productivity, and product yield within the semiconductor manufacturing industry is an ongoing endeavor. To that end, the industry has developed techniques to improve operative yield by "trimming" or electrically removing inoperable or defective memory or other circuits from the main circuit. In such instances, the integrated circuit also includes redundant memory arrays or circuits that are laid out so that they can be electrically incorporated into the integrated circuit design when the defective portions are detected. In the event that a given memory block is defective, that block can be effectively "trimmed" or electrically removed from the circuit by use of a fuse or a group of fuses that electrically disconnect the defective component from the main circuit. When a defective memory block or circuit is detected, the relevant fuse or fuses are "blown" to an open configuration such that the defective memory block or circuit is electrically removed from the circuit.

One way in which this objective has been achieved is by the use of a poly semiconductor e-fuse. A conventional poly semiconductor e-fuse typically consists of a polysilicon body that has a very narrow neck region and that is doped with a single type of dopant. The dopant used in such conventional devices is an N-type dopant, such as arsenic or phosphorous, and in many cases both are used, and is necessary to obtain good metal silicidation on the poly e-fuse. The polysilicon e-fuse is positioned within the circuit such that when it is opened or blown, it disconnects the defective component from the main circuit. A logic algorithm is then used to direct the data stream to the redundant memory block or circuit. The fuse is blown by applying a relatively high voltage to the polysilicon e-fuse such that the conductive layer in the narrow neck region melts. In most some instances, the underlying body portion of the polysilicon e-fuse also blows such that the two portions of the polysilicon e-fuse are completely and physically separated from each other.

However, in some instances, the body portion of the fuse does not physically separate, or if the fuse is successfully blown, the polysilicon can migrate, due to thermal and physical stresses, to re-establish a conductive path across the fuse. This can cause problems because in either instance the polysilicon e-fuse is still conductive, which causes the trimming effort to fail.

To circumvent the problems associated with these poly e-fuses, the industry has turned to the use of contact fuses. A contact fuse employs the use of a wide polysilicon body that does not include a narrow neck region as does the poly e-fuses. Further, a contact fuse is in that instead of blowing a region of the polysilicon, a contact that contacts the polysilicon is blown. While, the yield of contact fuses is very high and much better than the earlier polysilicon e-fuses, they too have disadvantages. In a small percentage of these fuses, the contact will sometimes blow near the top of the fuse, which is typically connected to a copper interconnect. In such instances, the blow will free copper that can then migrate to dielectric materials and the poly fuse body and create a conductive path to an adjoining structure under operational electrical bias. The free copper significantly degrades the device reliability. This allows an electrical connection to remain in place and decreases the fuse reliability within the device.

Accordingly, what is needed is a semiconductor device that avoids the disadvantages associated with the current devices.

SUMMARY OF THE INVENTION

The invention, in one embodiment, provides a semiconductor device that comprises a conducting layer that is located over a semiconductor substrate and a frustum-shaped contact having a narrow end that contacts the conducting layer. The device further comprises a first metal layer located over the conducting layer where a wide end of the frustum-shaped contact contacts the first metal layer. The frustum-shaped contact has a ratio of an opening of the wide end to the narrow end that is at least about 1.2.

In another embodiment, the invention provides a semiconductor device that comprises a conducting layer that is located over a semiconductor substrate, a first metal layer that is located over the contact fuse, and a heat sink that is located over and contacts the first metal layer.

BRIEF DESCRIPTION OF THE DRAWINGS

For a more complete understanding of the present invention, reference is now made to the following descriptions taken in conjunction with the accompanying drawings, in which:

FIGS. 2A-2J illustrate stages of manufacture of the semiconductor device of FIG. 1A;

DETAILED DESCRIPTION

Figure 1A:
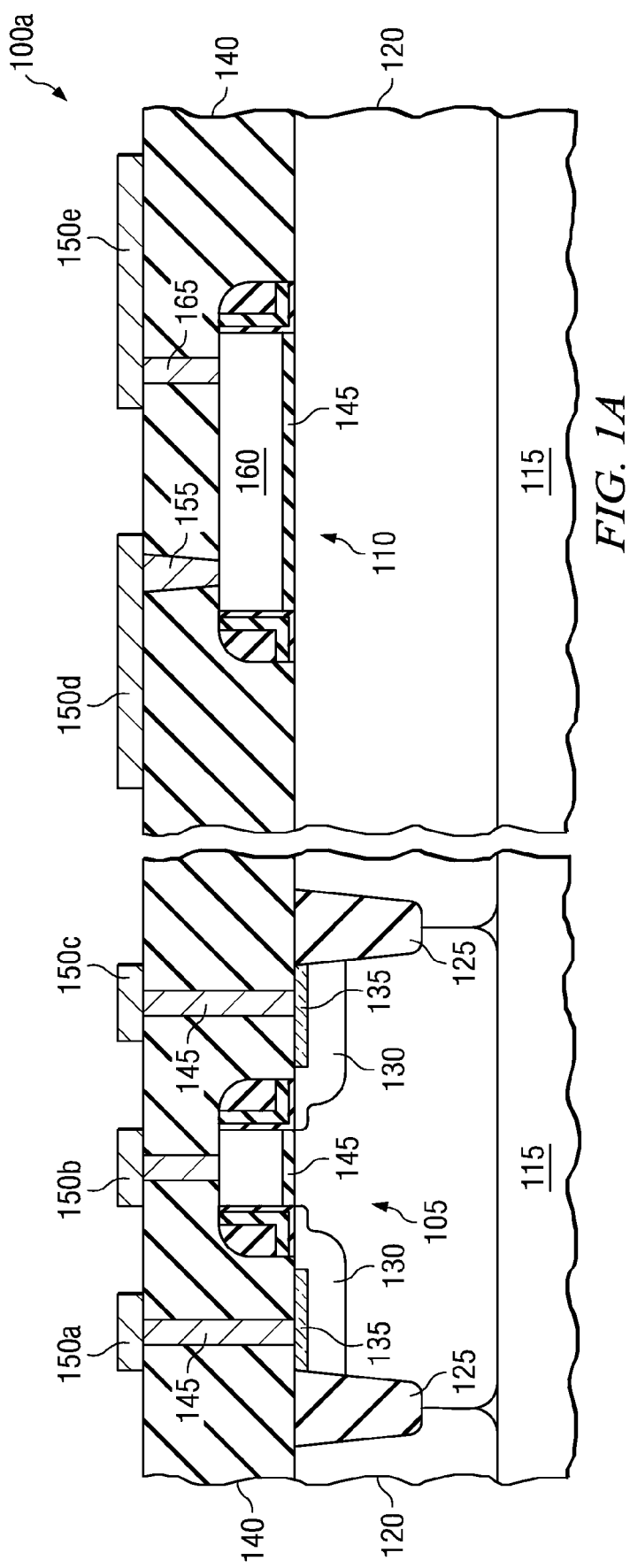
FIGS. 1A-1B illustrate different embodiments of semiconductor device provided by the invention.

FIG. 1A illustrates one embodiment of a semiconductor device 100*a* of the invention that includes a transistor 105 and contact fuse 110. The transistor 105 and contact fuse 110 are formed over s semiconductor substrate 115, such as a wafer. The 115 substrate may comprise conventional materials, such as silicon, silicon germanium, or gallium arsenide. An active layer 120 is located over the substrate 115. The active layer may be a doped portion of the substrate 115, or it may be a separately deposited and doped layer, such as an epitaxial layer. The transistor 105 comprises isolation structures 125, source/drains 130, and silicide contacts 135 that are formed within the active layer 120. In other embodiments, the source/drains 130 may be formed on top of the active layer 120.

A pre-metal dielectric (PMD) layer or interlevel dielectric layer 140 is located over the transistor 115 and contact fuse 110. Contacts 145 that include either or both contact plugs and vias, connect the source/drains 130 and transistor 115 to metal lines 150a-150c, which may comprise copper. The contact fuse 110 has a different contact configuration than contacts 145. The contact fuse 110 comprises a frustum-shaped contact 155 located at one end of the contact fuse body 160 that connects the contact fuse body 160 to a metal line 150d. The frustum-shaped contact 155 includes any barrier layers or liners that may be associated with the contact 155. In the illustrated embodiments, these barrier layers or liners are not shown for simplicity, but they may be present in other embodiments. As used herein, the term frustum-shaped includes any geometric configuration where a cross-sectional dimension increases from one end to the other, and is therefore, not limited to just conical shapes. The contact fuse 110 further includes another contact 165 located at an opposite end of the contact fuse body 160 that connects the contact fuse body 160 to metal line 150e. In the illustrated embodiment, the contact 165 is not frustum-shaped, but in other embodiments, it may be.

The wide end of the frustum-shaped contact 155 provides less resistance at the point it touches the metal line 150c, while the narrow end provides greater resistance. Since the resistance is less at the wide end, this increases the probability that the contact fuse 110 will blow adjacent the narrow end and away from the metal line 150c. This can reduce the formation of free copper and avoid the disadvantages associated with conventional contact fuse configurations.

Figure 1B:
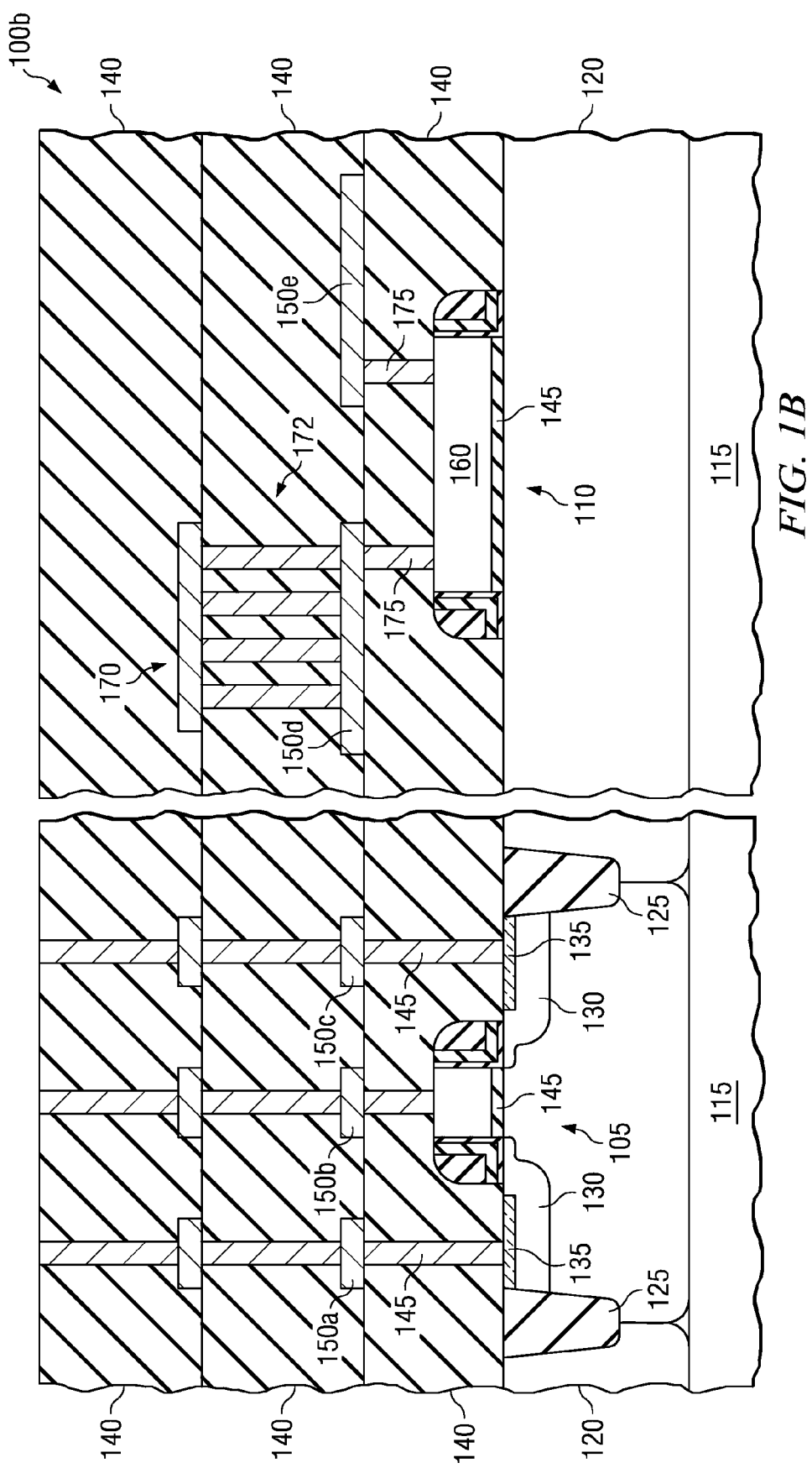

FIG. 1B shows another embodiment of a semiconductor device 100b of the invention. This embodiment may contain many of the same components as the embodiment of FIG. 1A, (numbered similarly). However, in this particular embodiment, the contact fuse 110 includes a heat sink 170 that is thermally coupled to the metal line 150d by one or more contacts 172. The contact fuse 110 is shown where neither of the contacts 175 is frustum-shaped, but it should be understood that the frustum-shaped contact discussed above may also be present in this embodiment. The heat sink pulls heat away from the metal line 150d and prevents heat build-up near the end of the contact 175 that touches the metal line 150d. This heat reduction increases the probability that the contact 175 will blow near the conducting layer 160 and away from the metal line 150. This can reduce the formation of free copper and avoid the disadvantages associated with conventional contact fuse configurations. Embodiments for making the devices shown in FIGS. 1A and 1B will now be discussed.

FIG. 2A illustrates a step in a method for fabricating the device 10a of FIG. 1A. In FIG. 2A, a dielectric layer 205 has been formed over the active layer 120, after the formation of trench isolation structures 125 and wells 210a and 210b. The trench isolation structures 125 may be filled with an oxide and may also include oxide liners. The wells 210a and 210b may be conventionally doped with an n-type dopant or a p-type dopant, and they may be doped similarly or differently. The dielectric layer 205 may extend over both a transistor region 206 and contact fuse region 207. The dielectric layer 205 may be a high quality layer that is thermally grown, such as an oxide. In other embodiments, it may comprise a stacked structure, such as metal/oxide or nitrogen/oxide. Conventional processes and materials may be used to form these components.

FIG. 2A also shows an electrode layer 212 located over the dielectric layer 205. In one embodiment, the electrode layer 212 may be comprised of a polysilicon or a metal silicide that is deposited over at least a substantial portion of the wafer in a blanket fashion. Alternatively, the composition of the electrode layer 212 may be different in the transistor region 206 than in the contact fuse region 207. For example, many manufacturers are beginning to use metal electrodes or metal silicided electrodes for transistors. In such embodiments, the contact fuse region 207 may be masked during the metal or metal silicide electrodes' formation. The portion of the electrode layer 212 in the transistor region 206 is masked during the polysilicon deposition in the contact fuse region 207. In the illustrated embodiment, however, the electrode layer 212 has the same composition in both the transistor region 206 and the contact fuse region 207. Conventional processes and materials may be used to deposit the electrode layer 212.

The electrode layer 212 is appropriately masked and subjected to a dopant implantation or diffusion process 214. The masking steps are not shown here, but it should be understood that the electrode layer 212 will be masked to expose the desired portions of the electrode layer 212 the selected implant. The exposed portion of the electrode layer 212 may be doped with either a p-type, such as boron, or n-type dopant, such as arsenic or phosphorous, to make the electrode layer 212 conductive. This doping may result in an NMOS or PMOS configuration. The portion of the electrode layer in the contact fuse region 207 may be doped with an n-type dopant or p-type dopant. Conventional implantation or diffusion processes, including dosage concentrations, may be used to dope the electrode layer 212. The dosage concentrations should be sufficient to impart the desired conductivity to the electrode layer 212.

FIG. 2B shows the device 100a of FIG. 2A following the deposition and patterning of a masking layer 216 used to form electrodes in the transistor and contact fuse regions 206 and 207. The masking layer 216 may be a conventional photoresist material and conventional lithographic techniques, such as photolithography or image transfer techniques, may be used to form the pattern.

Figure 2C:
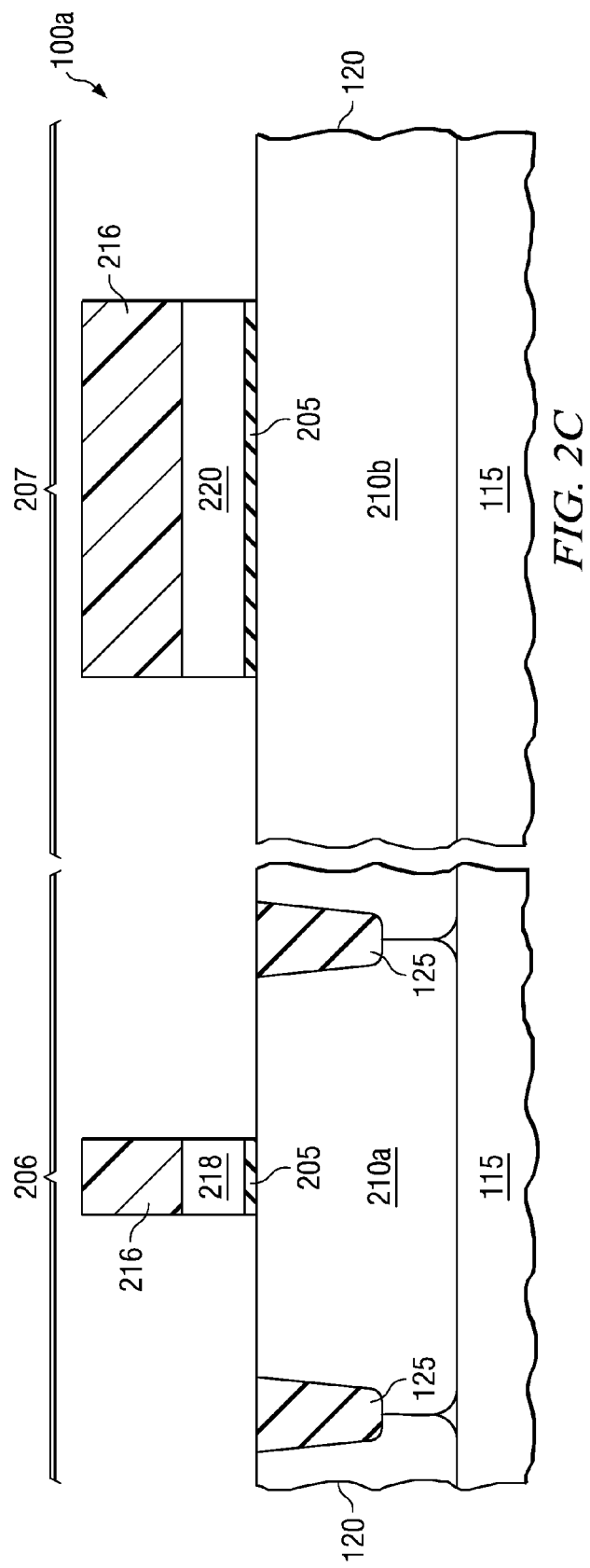

FIG. 2C shows the device 100a of FIG. 2B following the patterning that results in a gate structure 218 and conducting layer 220. Etching chemistries may be used to remove the electrode layer 212 and dielectric layer 205 located outside the perimeter of the patterned masking layer 216. Following the patterning, the masking layer 216 may be removed with conventional processes, such as a plasma etch process. The conducting layer 220 is configured differently from prior poly e-fuses. Prior poly e-fuses typically contained a very narrow body region that allowed the polysilicon body to be blown. Though the conducting layer 220 may include a narrower region, that region is not narrow enough to cause the polysilicon body to blow. To the contrary, its width is sufficient to cause the contact to blow instead of the polysilicon body.

FIG. 2D shows the device 100a of FIG. 2C after the deposition and pattering of a photoresist 221. The photoresist 221 is patterned to expose the transistor region 206 and protect the contact fuse region 207. The device 100a is then subjected to a doping implantation process 222 that forms optional lightly doped drain (LDD) extensions 224 adjacent the gate structure 218. In certain embodiments, the LDD extensions 224 may not be present. The extensions 224 may be formed adjacent the gate structure 218 and conventional process and doping concentrations may be used to deposit and pattern the photoresist and the extensions 224.

FIG. 2E illustrates the device 100a of FIG. 2D after several intermediate fabrication steps that are not shown or discussed in detail for brevity. These steps complete a basic transistor 226 and conducting layer 228. Following the formation of the extensions 224, oxide spacers 230 are formed on both the gate structure 218 and the conducting layer 220. The oxide spacers 230 may be stacked structures, such as those that are shown, or they may be comprised of a single layer. In one embodiment, the oxide spacers 230 may be formed by the CVD or PVD deposition of oxides or oxides and nitrides that is followed by an anisotropic etch. Following the formation of the oxide spacers 230, a photoresist material is deposited and patterned to expose the transistor 226 and protect the conducting layer 228. A source/drain implantation or diffusion process is conducted to form source/drains 232. Silicide contacts 234 may then be formed in the source/drains 232 and on top of the gate electrode layer 218 (not shown). Conventional materials, processes, and parameters may be used to form the oxide spacers 230, the source/drains 232, and the silicide contacts 234.

In FIG. 2F, a PMD or interlevel dielectric layer 236 is deposited over the transistor 226 and the conducting layer 228. Conventional processes and materials may be used to form the dielectric layer 236.

Figure 2G:
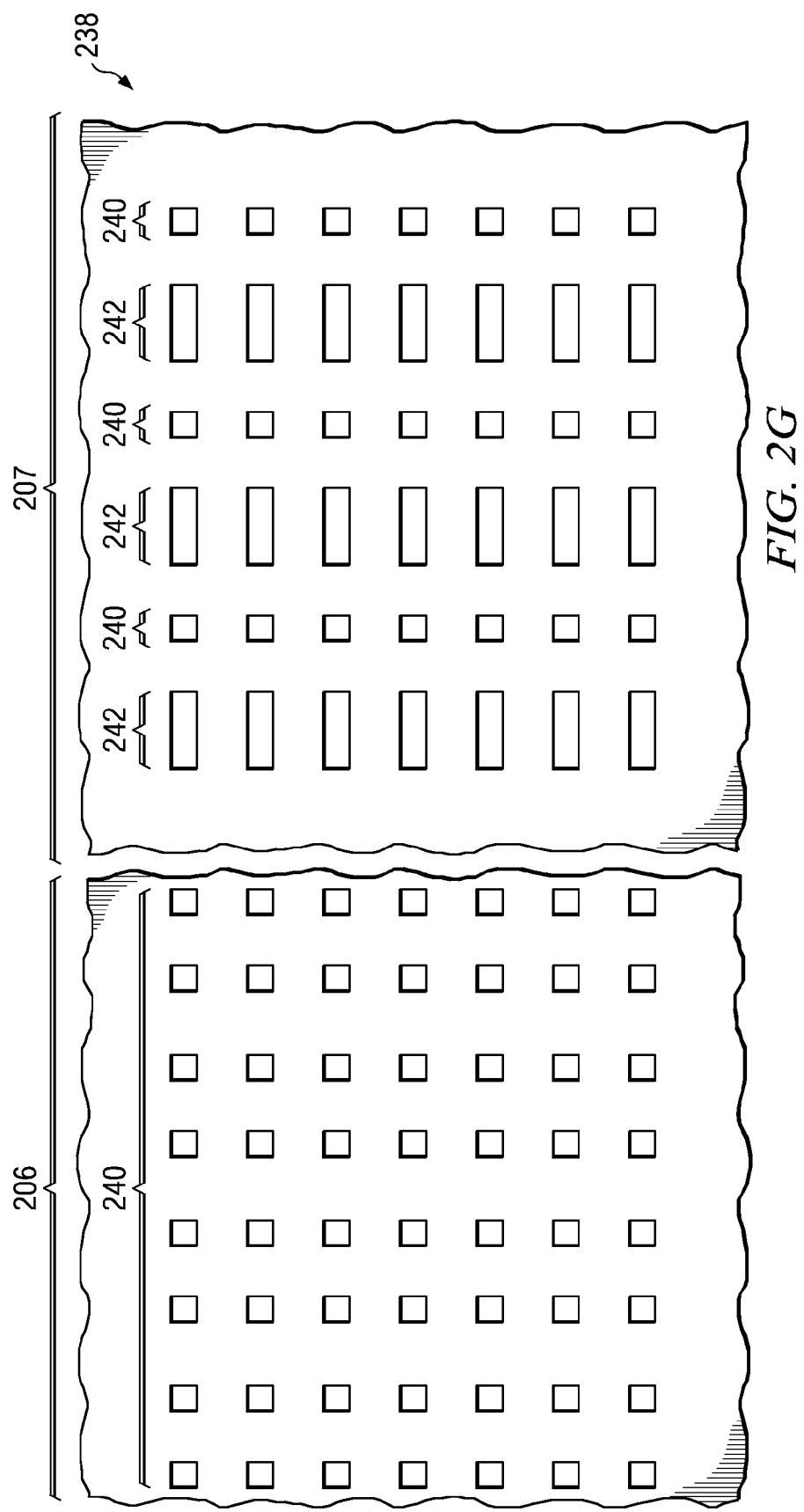

FIG. 2G is a general representation of one embodiment of a reticle 238 with which a photoresist may be imaged to form the different contact plug or via openings of the invention. FIG. 2G is for illustrative purposes, and the layout of the reticle 238 may have any different configurations. For example, in FIG. 2G, two different sized openings are shown. The openings 240 located in the transistor region 206 may have a length to width (L/W) ratio of about 1.0 (1:1). In those embodiments where the second contact of the contact fuse is not frustum-shaped, a portion of the openings 240 will also be located in the contact fuse region 207, as seen in FIG. 2G. The openings 242 used to form the frustum-shaped contacts have a larger L/W ratio than openings 240, and they may range from at least about 1.2 (1.2:1) to about 1.8 (1.8:1) or greater. Thus, L/W ratios larger than 1.8 are also within the scope of the invention. In those embodiments where both contacts of the contact fuse are frustum-shaped, the openings in the contact fuse region 207 will all be the same size as openings 242.

It is believed that the openings 240 and 242 will result in openings in a photoresist where the widths of the ends of the formed openings will have approximate or equal ratios. For example, in one embodiment a reticle opening of 210×160 nm (L/W ratio of 1.3) will result in a frustum-shaped opening in a photoresist with end widths of 120×90 nm (ratio of 1.3). Thus, the ratio of the widths of the respective ends of an opening formed with openings 240 will be about 1.0, and the ratio of the widths of the respective ends of an opening formed with openings 242 will range from at least about 1.2 to about 1.8.

These dimensions are particularly useful in the invention because they increase the surface area of the upper portion of the contact over that of the lower end. This reduces resistance at the upper end and increases the probability that the fuse will blow adjacent the lower end, which reduces the occurrence of free copper within the semiconductor substrate. For example, in one aspect, the upper portion of the contact may reduce resistance by as much as 44%. While ratios larger than 1.8 may also be employed, design considerations or limitations, such as device size and component density, will govern the uppermost limits of the ratio.

Figure 2H:
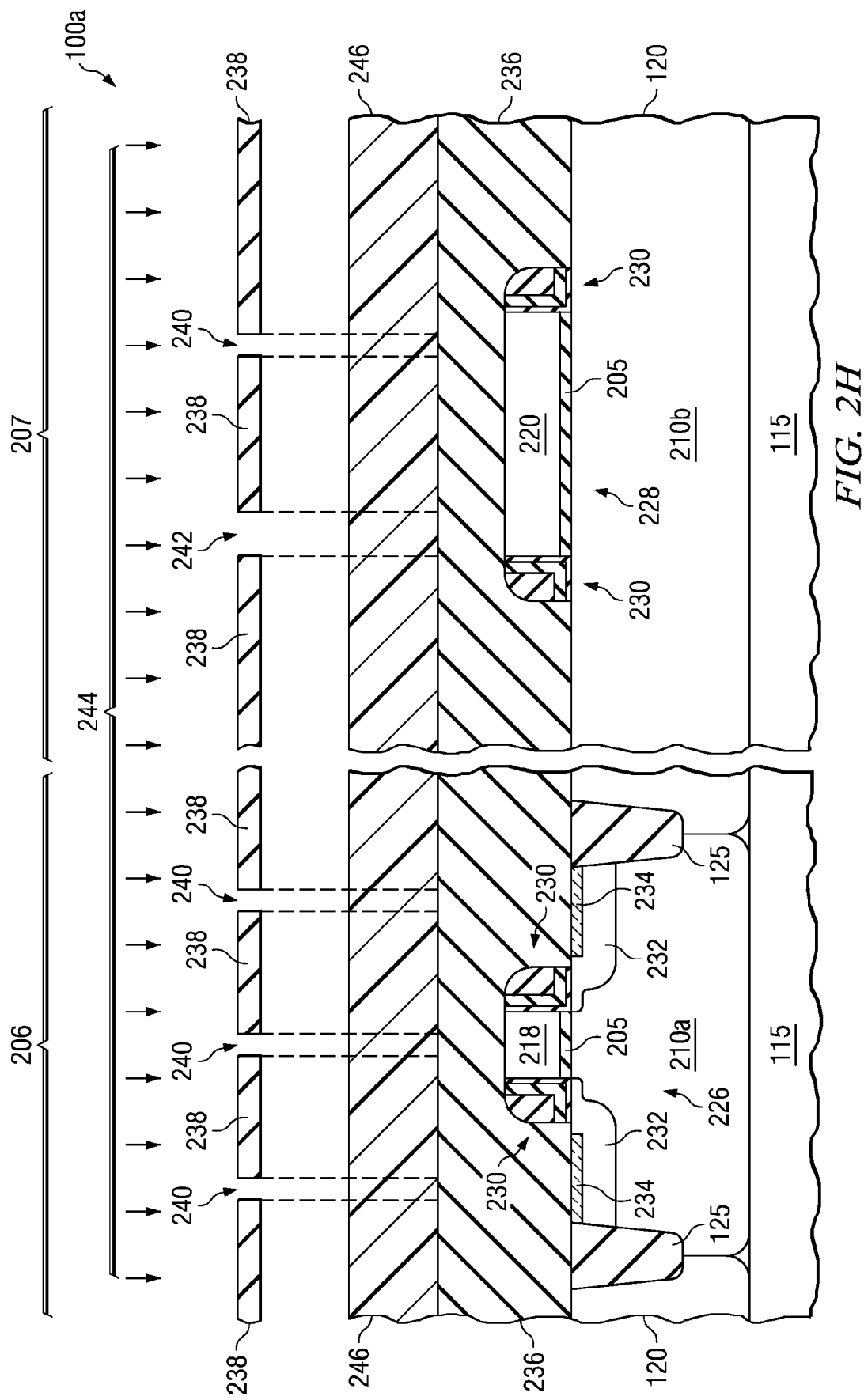

In FIG. 2H, the device 100a is illustrated being subjected to radiation 244 to expose a photosensitive material layer 246 through the mask 238 of FIG. 2G. As seen, the different sized openings 240 and 242 expose different sized portions of the layer 244 to the radiation. In the illustrated embodiment, the opening 242 will result in a frustum-shaped opening when etched and the openings 240 will result in substantially non-frustum-shaped openings. Conventional materials, such as photoresist, may be used to form layer 246 and conventional lithographic processes may be used to expose the layer 246 through the mask 238.

Figure 2I:
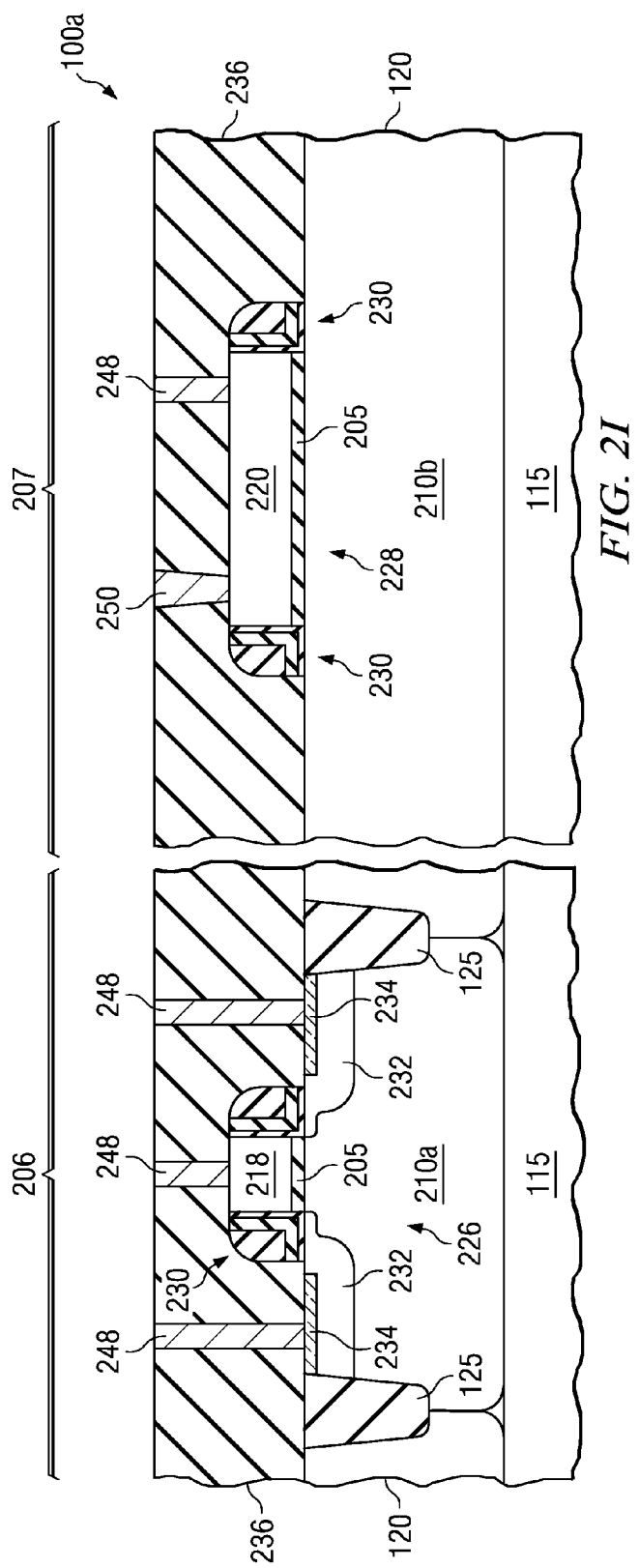

In FIG. 2H, the photosensitive layer 246 is patterned and etched to form guide openings (dashed lines). Another etch is then conducted to form openings in the dielectric layer 236. The remaining portions of the layer 246 are removed and clean steps are conducted. In FIG. 2I, a conductive metal, such as tungsten, is deposited in the etched openings. As mentioned above, barrier layers, such as tantalum/tantalum nitride or titanium/titanium nitride, may also be deposited before the deposition of the conductive metal. The excessive metal is removed by etching processes or chemical/mechanical planarization processes. This results in the substantially non-frustum-shaped contacts 248 in the transistor region 206 and 207 and the frustum-shaped contact 250 in the contact fuse region 207. A contact is substantially non-frustum-shaped if the ratio of the width of the openings at the bottom and the top is about one or less than 1.2. Thus, in some embodiments, contacts 248 may not be perfectly straight and may have a slight angular displacement due to the etching process. Conventional materials and processes may be used to achieve these steps.

Figure 2J:
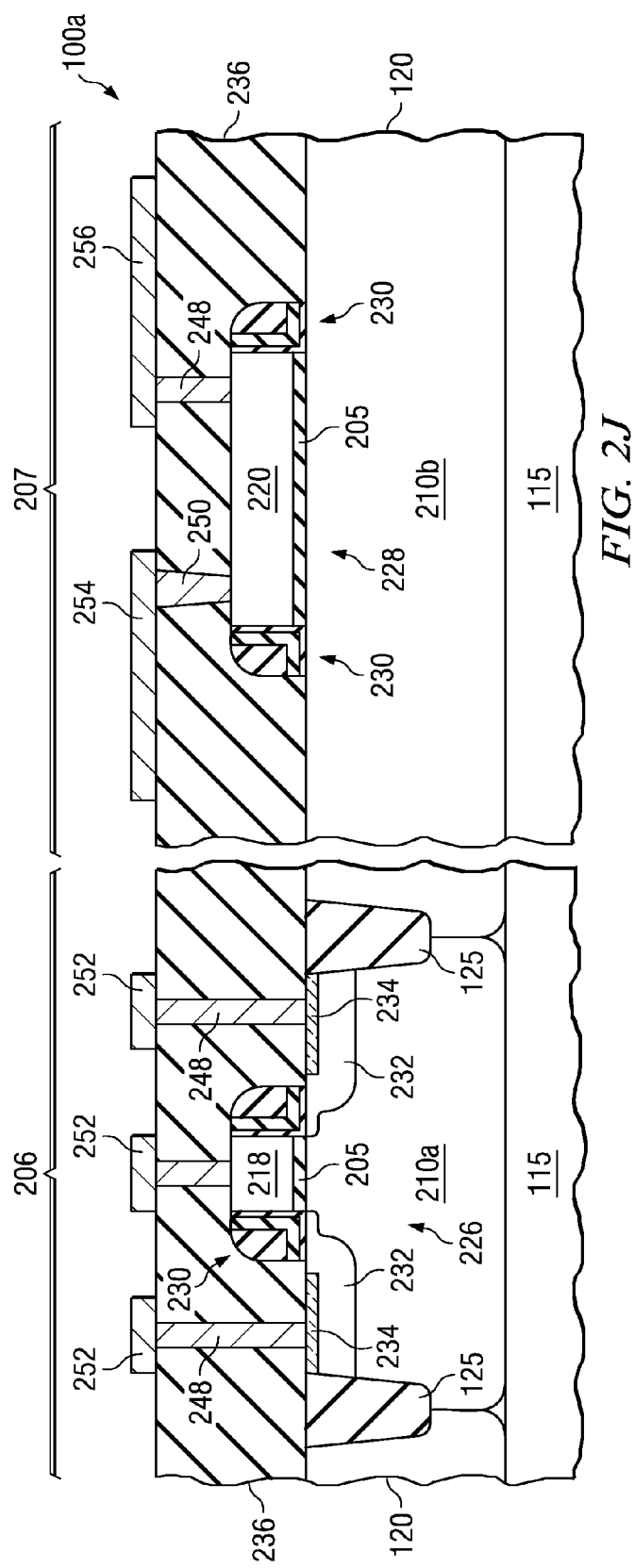

In FIG. 2J, following the formation of contacts 248 and 250, an interconnect metal layer, such as copper, is deposited over the dielectric layer 236 and is patterned. The patterning process forms metal lines 252 in the transistor region 206 and a metal line 254 that contacts the frustum-shaped contact 250 and a metal line 256 that contacts the non-frustum shaped contact 248. The processes used to deposit and pattern the metal layer may be conventional.

The frustum-shaped contact is opposite to industry practices. Because of the continued downsizing of devices and increased component densification, the industry has worked hard to develop photolithographic techniques and etch processes that provide substantially non-frustum-shaped or vertically straight contacts. The invention recognizes the advantages associated with using frustum-shaped contacts or vias in the contact fuse area, while keeping other contact dimensions within industry standards. Thus, the invention provides a semiconductor device that provides both types of contacts, each providing their advantages to the device.

Figure 3A:
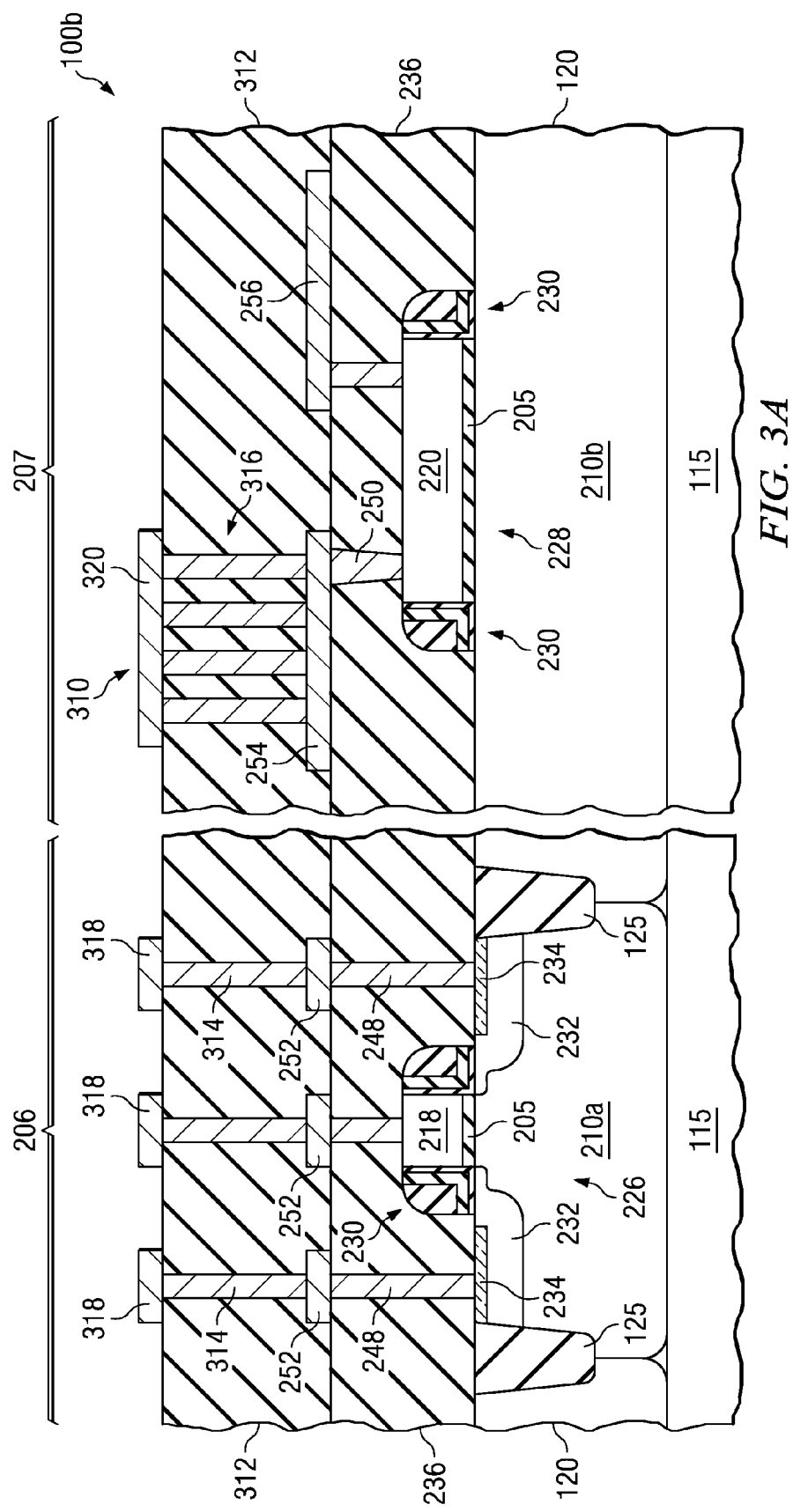
FIGS. 3A-3B illustrate the formation of a heat sink to arrive at the semiconductor device of FIG. 1B.

At this point in the fabrication process, conventional processes and materials could be used to complete the device 100a. However, in those embodiments that include the heat sink 170 of FIG. 1B, additional steps are conducted to construct the heat sink. FIG. 3A illustrates a method step for making the semiconductor device 100b that incorporates a heat sink 310. In FIG. 3A, an interlevel dielectric layer 312 is deposited over the metal lines 252, 254, and 256. The dielectric layer 312 can then be patterned and etched in the same way as dielectric layer 236. Non-frustum-shaped vias 314 may be formed in the transistor region 206 in the same way as contacts 248. Concurrently, non-frustum-shaped vias 316 may be formed in the contact fuse region 206. In one embodiment, multiple vias 316 are formed to conduct heat from the metal line 254. The vias 316 serve as cooling fins that pull heat from the metal line 254. The vias 316 contact the metal line 254 as shown in FIG. 3A. Though barrier layers are not shown, vias 314 and 316 may include them.

Figure 3B:
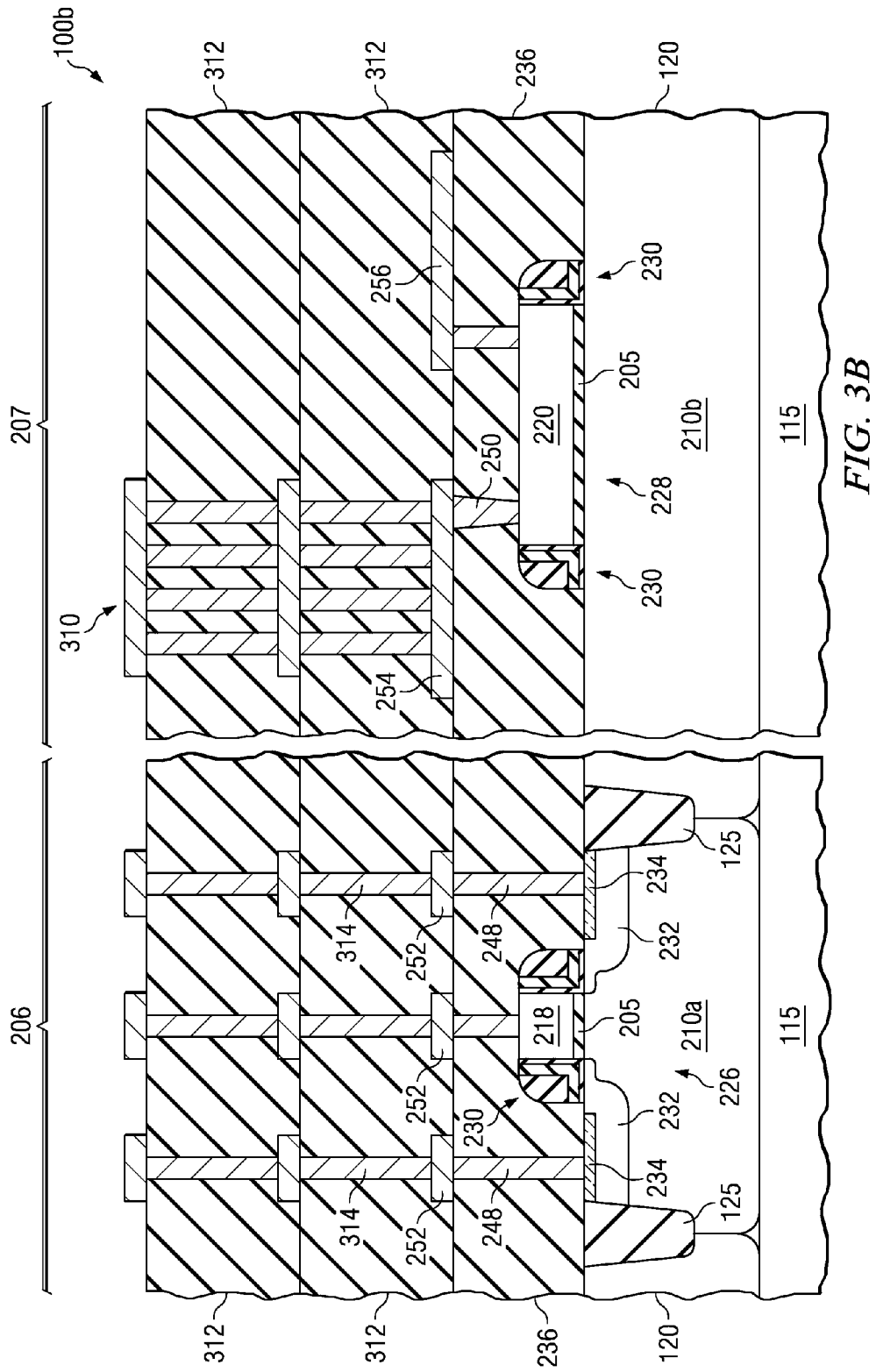

Following the completion of the vias 314 and 316, another metal level, such as copper, is deposited and patterned to form metal lines 318 in the transistor region 206 and metal line 320 in the transistor region 207. Similar process to those stated above may also be used to form metal lines 318 and 320. In one embodiment, these steps complete the construction of the heat sink 310 and conventional processes and materials could be used to complete the semiconductor device. However, in another embodiment, as shown FIG. 3B, the heat sink 310 may include any number of additional metal levels interconnected by contact or vias. In the embodiment shown in FIG. 3B, the heat sink includes two metal levels. A purpose of the heat sink 310 is to pull heat from the metal line 254 and the upper portion of the frustum-shaped contact 250. If the frustum-shaped contact 250 were to become overheated it could blow near the metal line 254, thereby freeing copper. In one embodiment, the heat sink does not function to provide electrical connection between lower levels and upper levels. In such embodiments, it is not directly connected to any overlying interconnects. Moreover, the heat sink's construction does not require any special processing steps as the same steps used to form the metal lines, contacts, and vias in the transistor region 206 can be used to form the heat sink 310 in the contact fuse region 207. Thus, the incorporation of the heat sink 310 into the device 100b is compatible to current process flow and at no extra cost.

The heat sink 310 improves the cooling (e.g., by greater than about 50%), and the addition of metal thermal mass on top of the metal line 254 prevents the metal-1 (i.e., metal line 254) fusion by about 55%. That is, the more metal that is present, more energy is needed to melt the metal. By adding additional metal mass on the top of metal line 254, it will require more energy to melt the whole structure. However, since the blow energy is essentially fixed, it is impossible to blow the top by melting the larger metal structure.

Figure 4A:
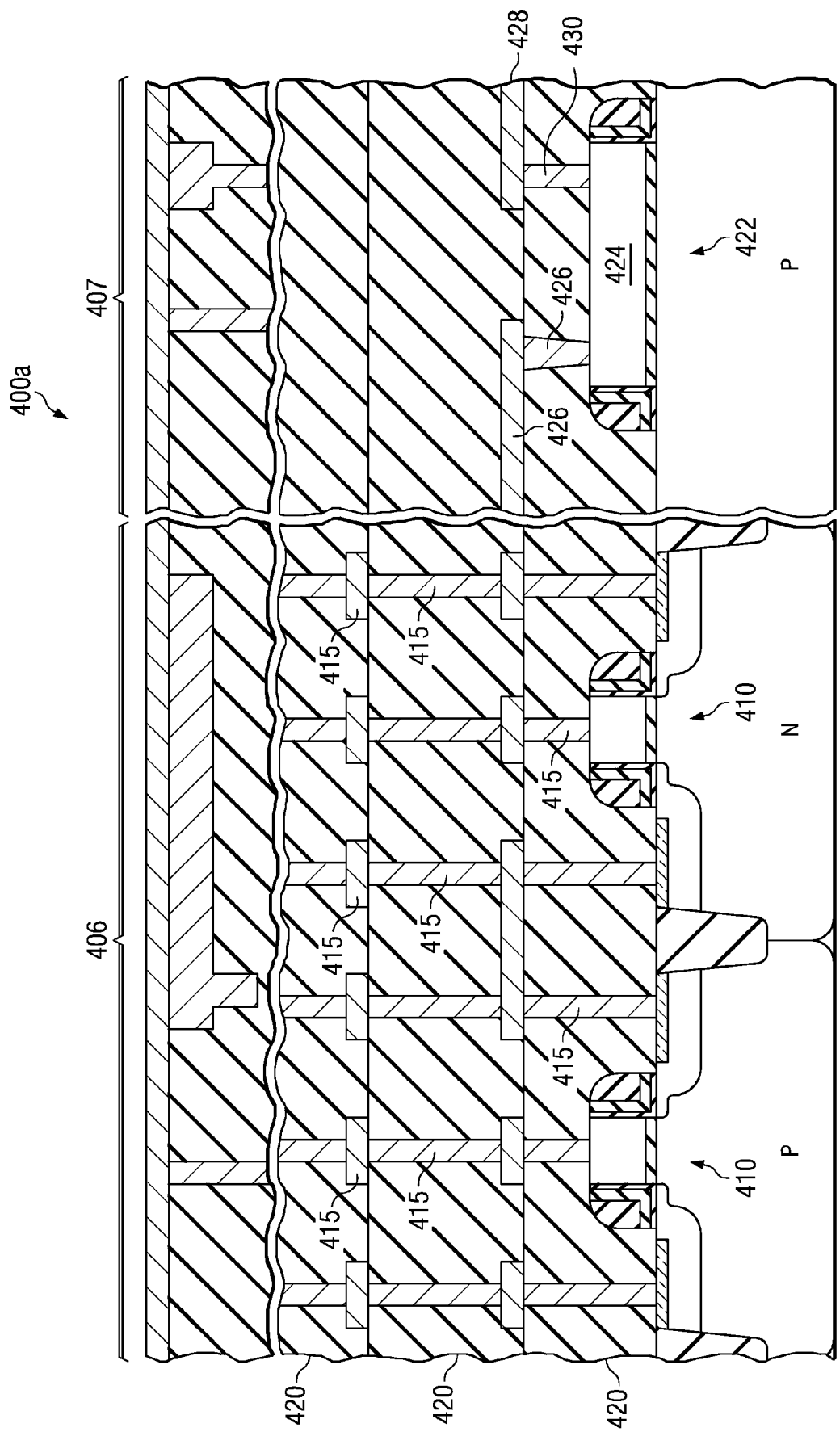
FIGS. 4A-4B illustrate ICs that respectively incorporate the semiconductor devices of FIGS. 1A and 1B.

FIG. 4A illustrates the semiconductor device 100a configured as an IC 400a. The IC 400a is well suited for a number of electrical applications where it is desirable to have the ability to trim a portion of malfunctioning or inoperative circuits. The IC 400a may be a completed semiconductor chip or die or a portion thereof. It may also be configured as any number of electrical devices, such as a memory array, an analog circuit, or digital circuit, etc. The IC 400a includes a transistor region 406 and contact fuse region 407. The transistor region 406 includes transistors 410, as those described above and metal interconnects, generally designated 415 that are formed in dielectric layers 420. The contact fuse region 407 includes the contact fuse 422 that includes a contact fuse body 424, a frustum-shaped contact 426 that connects one end of the contact fuse body 424 to a metal line 426. The opposite end of the contact fuse body 424 is connected to a second metal line 428 by a substantially non-frustum-shaped contact 430, as described above. Other embodiments provide for the contact 430 to be frustum-shaped.

Figure 4B:
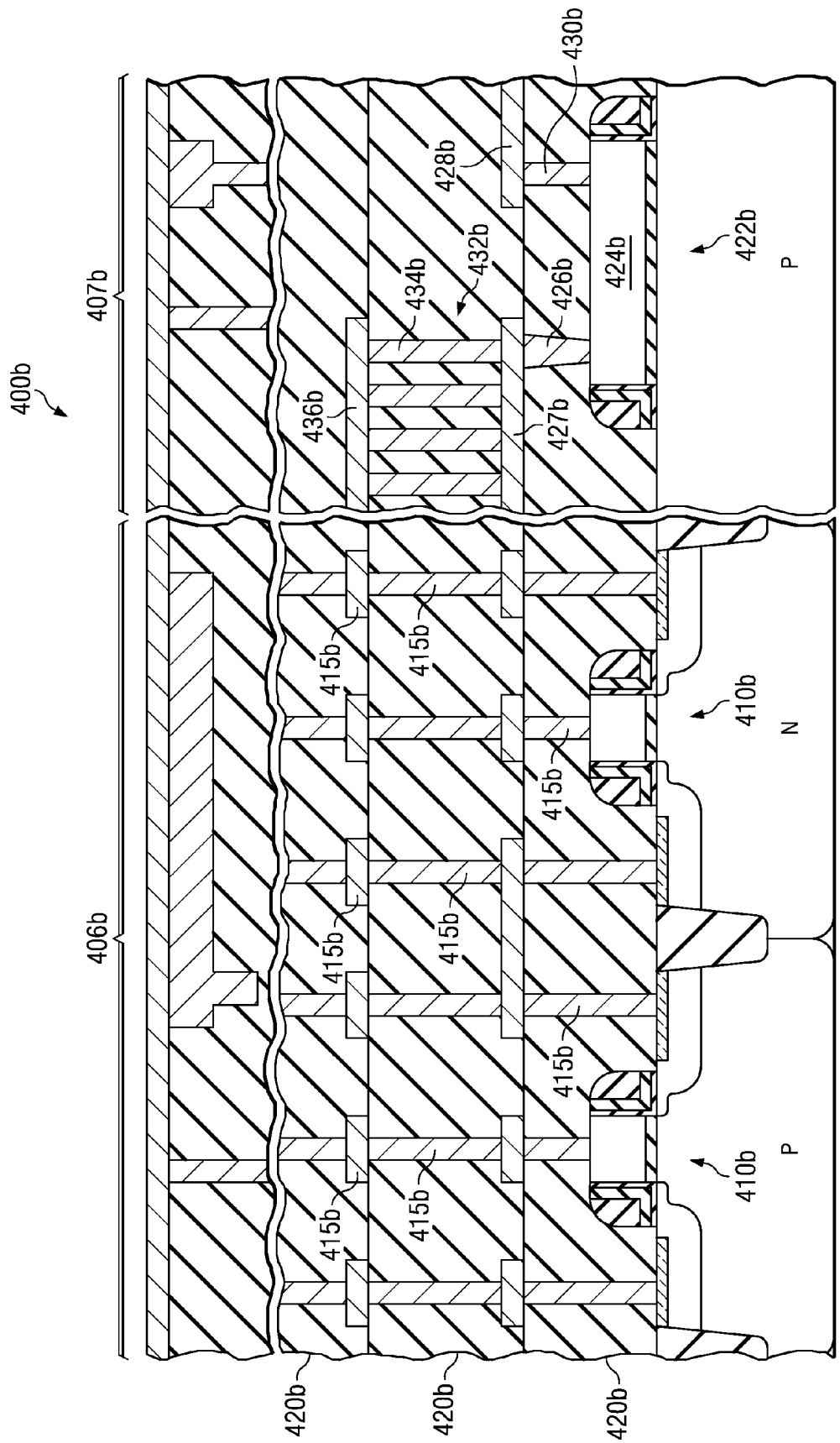

FIG. 4B illustrates the semiconductor device 100b configured as an IC 400b. The IC 400b is also well suited for a number of electrical applications where it is desirable to have the ability to trim a portion of malfunctioning or inoperative circuits. The IC 400b may be a completed semiconductor chip or die or a portion thereof. It may also be configured as any number of electrical devices, such as a memory array, an analog circuit, or digital circuit, etc. The IC 400b includes a transistor region 406b and contact fuse region 407b. The transistor region 406 includes transistors 410b, as those described above and metal interconnects, generally designated 415b, that are formed in dielectric layers 420b. The contact fuse region 407b includes the contact fuse 422b that includes a contact fuse body 424b, a frustum-shaped contact 426b that connects one end of the contact fuse body 424b to a metal line 427b.

In another embodiment, the frustum-shaped contact 426b may be a substantially non-frustum-shaped contact, as discussed above. The opposite end of the contact fuse body 424b is connected to a second metal line 428b by a substantially non-frustum-shaped contact 430b. Other embodiments provide for the contact 430b to be frustum-shaped. The contact fuse 422b also includes a heat sink 432b, as discussed above.

Multiple vias 434b connect the metal line 427b to a second metal line 436b. The heat sink 432b is not directly connected to any overlying layers or structures, as indicated in FIG. 4B.

Those skilled in the art to which the invention relates will appreciate that other and further additions, deletions, substitutions and modifications may be made to the described embodiments without departing from the scope of the invention.

What is claimed is:

1. A semiconductor device, comprising:
   a conducting layer located over a semiconductor substrate;
   a first metal layer over the conducting layer;
   a frustum-shaped contact having a narrow end that contacts the conducting layer and a wide end that contacts the first metal layer; the frustum-shaped contact having a width ratio of the wide end to the narrow end of least about 1.2; thereby establishing less resistance at the wide end than at the narrow end, and a defining a contact fuse predisposed to blow adjacent the narrow end.

2. The device recited in claim 1, wherein then width ratio is within a range of 1.2 to 1.8.

3. The device recited in claim 1, further comprising a heat sink located over and contacting the first metal layer.

4. The device recited in claim 3, wherein the heat sink is unconnected to any overlying metal layer or structure.

5. The device recited in claim 1, wherein a second metal layer is located over the conducting layer and a contact connects the second metal layer with the conducting layer, the contact having an end to end width ratio less than 1.2.

6. The device recited in claim 1, wherein the device further comprises:
   at least one transistor located over the semiconductor substrate and configured to control a blowing of the contact fuse;
   at least one dielectric layer located over the at least one transistor and the contact fuse; and
   one or more interconnects formed in and over the dielectric layers that contact the transistor and the contact fuse.

7. The device recited in claim 6, wherein the one or more interconnects include contact plugs or vias having an end to end width ratio of about 1.0.

8. The device recited in claim 1, wherein the first metal layer is a copper interconnect.

9. A semiconductor device, comprising:
   a contact fuse having a conducting layer located over a semiconductor substrate, and a frustum-shaped contact having a narrow end that contacts the conducting layer and a wide end; the frustum-shaped contact having a width ratio of the wide end to the narrow end of at least about 1.2; thereby establishing less resistance at the wide end than at the narrow end;
   a first metal layer located over the contact fuse in contact with the wide end; and
   a heat sink located over and contacting the first metal layer; the heat sink cooperating with the frustum-shaped contact to predispose the contact fuse to blow adjacent the narrow end.

10. The device recited in claim 9, wherein the heat sink is unconnected to any overlying metal layer or structure.

11. The device recited in claim 9, wherein the width ratio is within a range of 1.2 to 1.8.

12. The device recited in claim 9, wherein the first metal layer is a copper interconnect.

13. The device recited in claim 12, wherein the heat sink comprises a plurality of vias formed within one or more interlevel dielectric layers to define cooling fins thermally coupled to the contact of the frustum-shaped contact wide end with the first metal layer.

14. The device recited in claim 13, wherein the device further comprises a one or more transistors; and the vias defining the cooling fins are formed in a same process that forms metal lines, contacts and vias for establishing electrical connections of the one or more transistors.

15. A semiconductor device comprising:
- a transistor and a contact fuse formed on a semiconductor substrate;
- one or more interlevel dielectric layers formed over the transistor and the contact fuse;
- a plurality of first contacts connecting source/drains of the transistor to first metal lines formed in the one or more interlevel dielectric layers;
- the contact fuse comprising a contact fuse body, and a plurality of second contacts connecting opposite ends of the contact fuse body to respective second metal lines formed in the one or more interlevel dielectric layers; at least one of the second contacts comprising a frustum-shaped contact with a cross-sectional dimension that increases from a narrow end in contact with the fuse body to a wide end in contact with the respective second metal line; the frustum-shaped contact having a wide end to narrow end width ration of at least 1.2, thereby providing a greater resistance at the narrow end contact with the fuse body than at the wide end contact with the respective second metal line and predisposing the contact fuse to Now adjacent the narrow end.

16. The device recited in claim 15, further comprising a heat sink thermally coupled to the respective second metal line in contact with the at least one frustum-shaped second contact; the heat sink serving to further predispose the contact fuse to blow adjacent the narrow end.

17. The device recited in claim 16, wherein the heat sink comprises a plurality of vias formed within the one or more interlevel dielectric layers to define cooling fins configured and adapted to pull heat from the contact of the at least one frustum-shaped second contact with the respective second metal line.

18. The device recited in claim 17, wherein the vias defining the cooling fins are formed in the same process steps used to form metal lines, contacts and vias for establishing electrical connections of the transistor.

19. The device recited in claim 17, wherein the first and second metal lines comprise copper.

20. The device recited in claim 15, wherein the first and second metal lines comprise copper.

* * * * *